(12) United States Patent
Westphall

(10) Patent No.: US 8,174,824 B2
(45) Date of Patent: May 8, 2012

(54) ENCLOSURE WITH ACCESS PANEL

(75) Inventor: Paul E. Westphall, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 12/645,372

(22) Filed: Dec. 22, 2009

(65) Prior Publication Data

US 2011/0149524 A1 Jun. 23, 2011

(51) Int. Cl.
G06F 1/16 (2006.01)

(52) U.S. Cl. ............ 361/679.33; 200/4.02; 702/56; 165/104.33

(58) Field of Classification Search .......... 455/575.4, 455/550.1, 90.1, 349; 361/695, 725, 679.53, 361/679.54, 679.55, 679.06, 679.07, 679.26, 679.27; 702/57, 56; 165/104.33
See application file for complete search history.

(56) References Cited

U.S. PATENT DOCUMENTS

| | | | |
|---|---|---|---|
| 6,442,030 B1 * | 8/2002 | Mammoser et al. | 361/727 |
| 6,922,336 B2 | 7/2005 | Barsun et al. | |
| 7,558,075 B2 | 7/2009 | Nguyen et al. | |
| 2007/0067119 A1 * | 3/2007 | Loewen et al. | 702/57 |
| 2008/0013275 A1 * | 1/2008 | Beckley et al. | 361/695 |
| 2008/0197129 A1 * | 8/2008 | Gosche | 220/4.02 |

* cited by examiner

*Primary Examiner* — Hung Duong

(57) ABSTRACT

Techniques for accessing an enclosure are disclosed herein. In one embodiment, an enclosure is configured for rack mounting. The enclosure includes an access panel disposed in a top surface of the enclosure. The access panel is moveably coupled to the enclosure and configured to provide access to the interior of the enclosure.

19 Claims, 6 Drawing Sheets

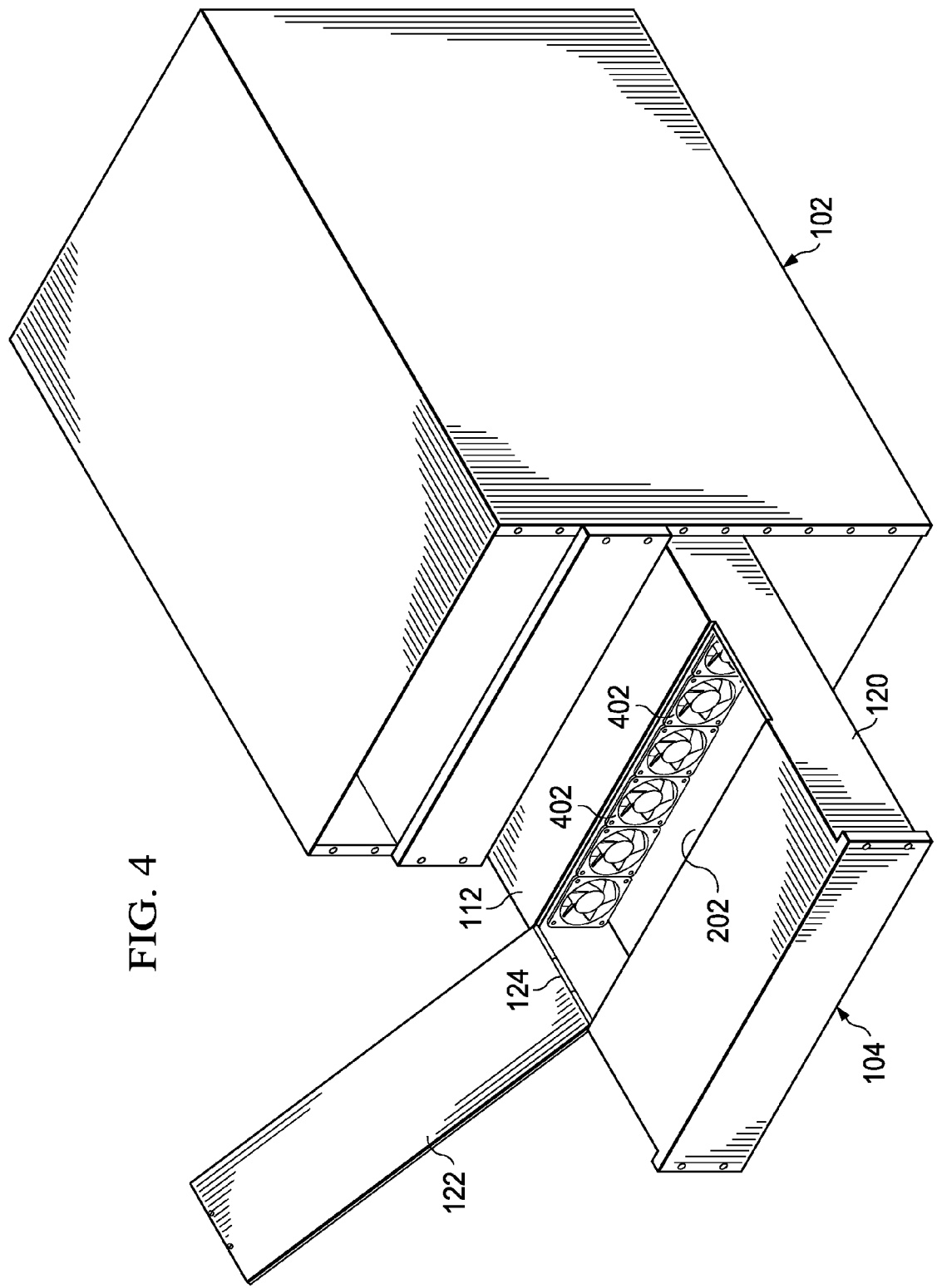

ENCLOSURE WITH ACCESS PANEL

BACKGROUND

Computer modules are often installed in cabinets or racks. Rack mounting allows housing of multiple computer modules in a relatively small space. Like other electronic systems, rack mounted computers include internal components that may require repair, replacement or upgrade.

BRIEF DESCRIPTION OF THE DRAWINGS

For a detailed description of exemplary embodiments of the invention, reference will now be made to the accompanying drawings in which:

FIG. 4 shows a cabinet and a rack mounted enclosure providing access to components within the enclosure in accordance with various embodiments;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

The term "moveably coupled" is intended to mean moveable while attached. Thus, part A is moveably coupled to part B if part A is moveable in relation to part B while remaining attached to part B.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Rack mounting of computer components (e.g., server computers) provides for more efficient space utilization than does stand-alone computer packaging. In order to access the internal components of a rack-mounted computer for repair, replacement, upgrade, etc., a rack-mounted unit generally must be completely removed from the rack or at least fully extended from the rack. Consequently, the unit must be electrically disconnected from other portions of the system and/or removed from service during access.

Embodiments of the present disclosure allow a rack-mounted unit to remain connected and operational while allowing access to the internal components of the unit. An access panel in the top surface of the rack-mountable enclosure provides access to the components within the enclosure while the enclosure is partially extended from the rack.

Figure 1:
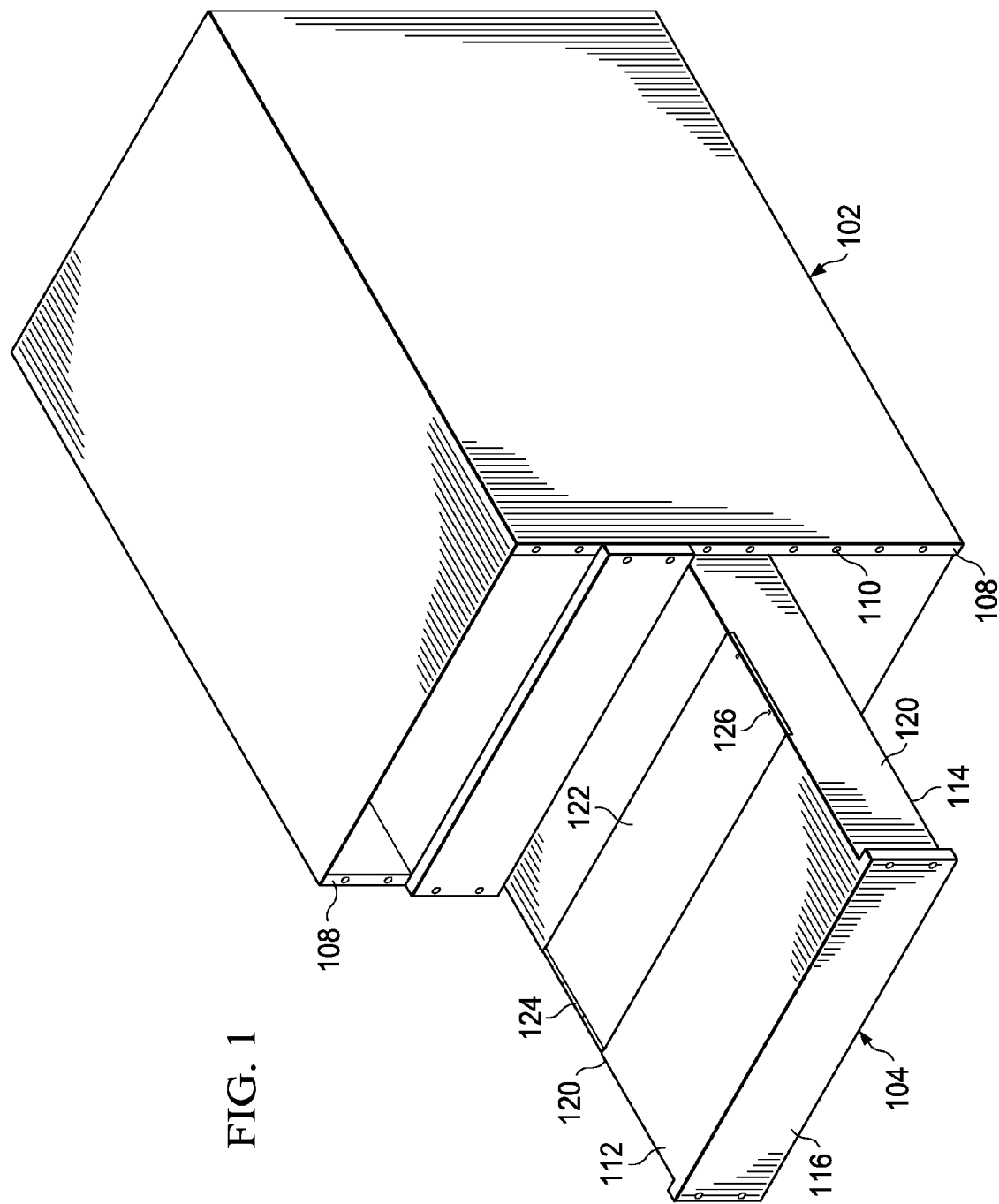
FIG. 1 shows a cabinet and a rack mounted enclosure that includes an access panel in accordance with various embodiments.

FIG. 1 shows a cabinet 102 and a rack mounted enclosure 104 that includes an access panel 122 in accordance with various embodiments. The cabinet 102 (i.e., rack), for example, may be a 19" EIA (Electronics Industry Alliance) rack designed to house electronics packages that are 17¾" in width. The height and depth of the cabinet 102 may vary. The cabinet 102 includes a structural frame typically having four rigid corner posts 108 connected by cross members and structural supports. Each of the four corner posts include a plurality of mounting holes 110, though which rack-mountable enclosures can be secured to the cabinet 102.

The rack-mountable enclosure 104 is shown extending from the front of the cabinet 102. The enclosure 104 is dimensioned for mounting in the cabinet 102. For example if the cabinet 102 is a 19" rack, then the enclosure 104 may be 17¾" in width. The height of the enclosure 104 can vary but, to be compatible with the standard EIA rack mounting structure, some embodiments are an integer multiple of an EIA unit called simply the "U." An EIA U is 1.75 inches. Electronic equipment generally has a height in multiples of "U's" e.g., 1U (1.75"), 2U (3.50"), 3U (5.25"), etc.

The enclosure 104 may be mounted from the front of the cabinet 102 as shown. Other embodiments mount from the rear of the cabinet 102. Screws, such as thumbscrews may be employed to secure the enclosure 104 to the cabinet 102, and to facilitate installation and removal of the enclosure 104. In some embodiments, the enclosure 104 may be supported by drawer slides attached to the cabinet 102 and to the enclosure 104.

The enclosure 104 includes a top panel 112, a bottom panel 114, a front panel 116, a rear panel 118 (see FIG. 2), and side panels 120. An access panel 122 is disposed in the top panel 112 of the enclosure 104. The access panel 122 may be opened when the enclosure 104 is partially extended from the cabinet 102. A hinge 124 connects the access panel 122 to the enclosure 104. The hinge 124 may be mounted to an inner or outer surface of the enclosure 102 and/or the access panel 122. A non-hinged side of the access panel 122 may be secured to the enclosure 104 by a screw, latch, or other retaining mechanism. For example, the access panel 122 may be secured to the enclosure 104 via screws through the mounting holes 126.

The access panel 122 is disposed in the top panel 112 of the enclosure 104 at a location that allows the panel to be opened when the enclosure 104 is only partially withdrawn from the cabinet 102. For example, the access panel 122 may disposed only in the front half of the top panel 112, allowing access to the inside of the enclosure 104 when the enclosure is no more than half withdrawn from the cabinet 102.

Figure 2A:
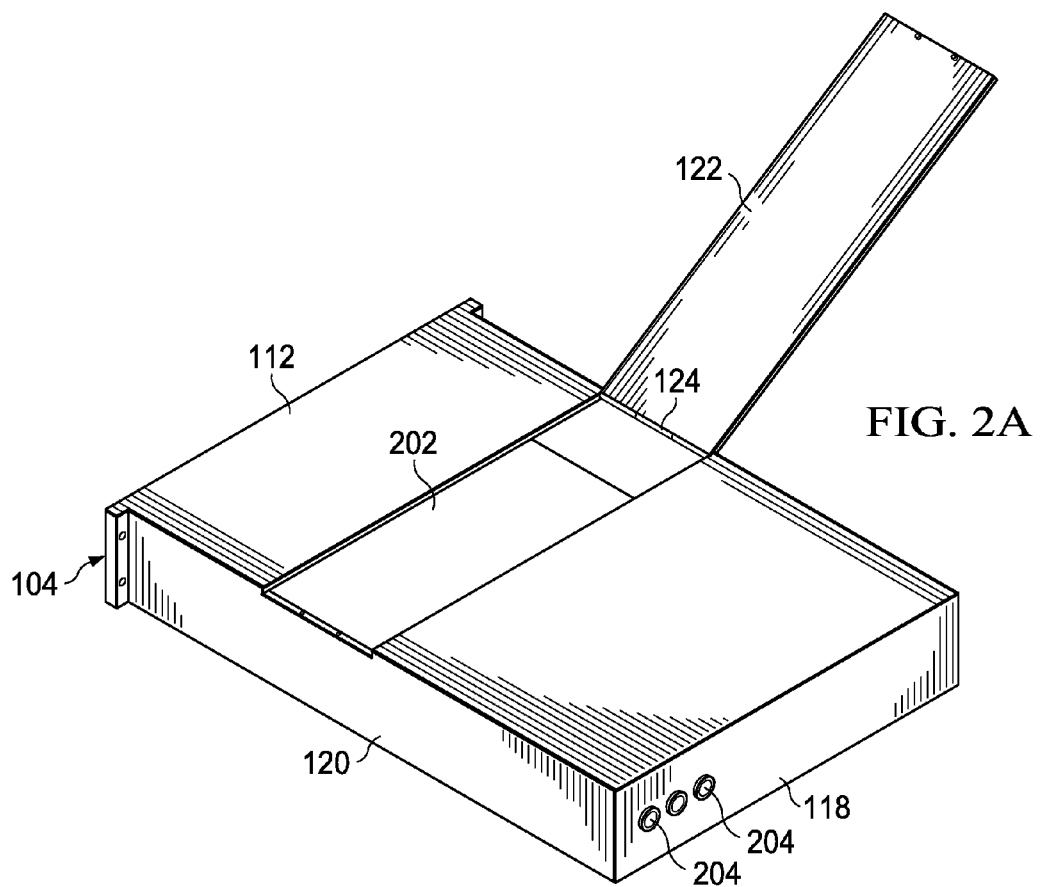
FIGS. 2A and 2B show a rack mountable enclosures that includes a laterally pivoting access panel in accordance with various embodiments.

FIG. 2A shows a view of a rack mountable enclosure 104 that includes a laterally pivoting access panel 122 in accordance with various embodiments. The hinge 124 is attached to a side of the access panel 122 and to a side 120 of the enclosure 104 or a side portion of the top panel 112. Thus, the interior 202 of the enclosure 104 is accessed by releasing a retaining mechanism (e.g., screws) and swinging the access panel 122 laterally across the enclosure 104 on the hinge 124.

In some embodiments, the hinge 124 may be disposed on the side of the access panel 122 opposite that shown in FIG. 2. In such an embodiment, the access panel 122 swings laterally across the enclosure 104, but contrary to the direction shown.

One or more electrical connectors 204 may be provided in the rear panel 118 of the enclosure 104 to connect the enclosure 104, via cabling, to a power source and/or other enclosures or devices installed in the cabinet 102 or elsewhere.

Figure 2B:
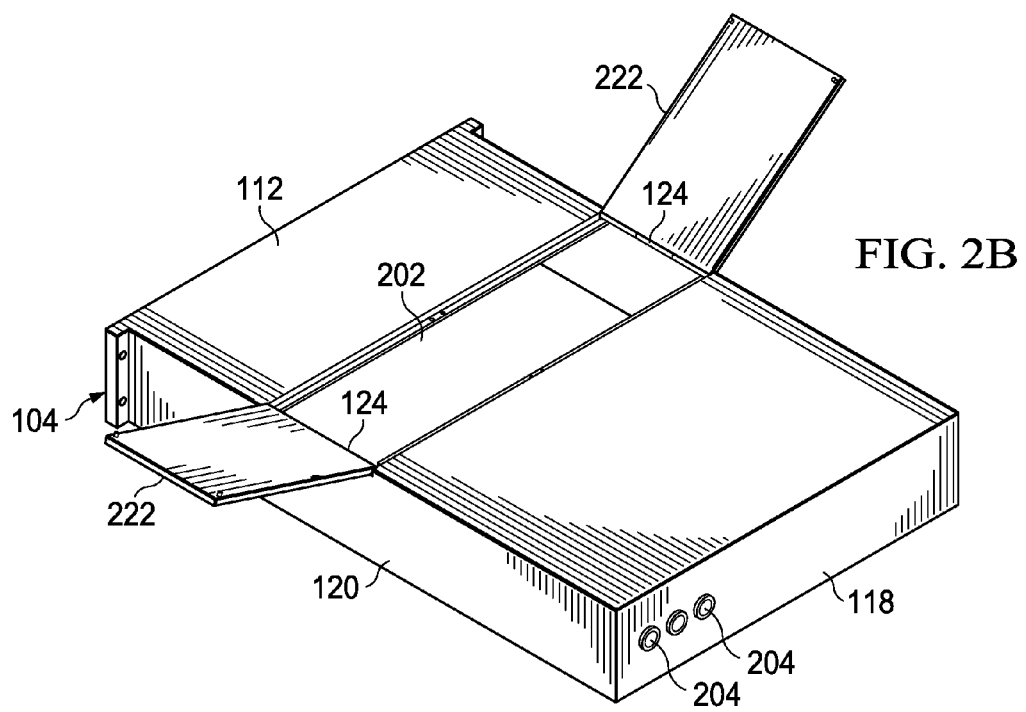

FIG. 2B show a view of a rack mountable enclosure 104 that includes a plurality of laterally pivoting access panels 222 in accordance with various embodiments. Each access panel 222 is covers a portion of the width of the enclosure 104, and is moveably coupled to the enclosure 104 by a hinge 124. A retention mechanism (e.g., screws) may be employed to secure the access panels 222 to the enclosure 104.

Figure 3:
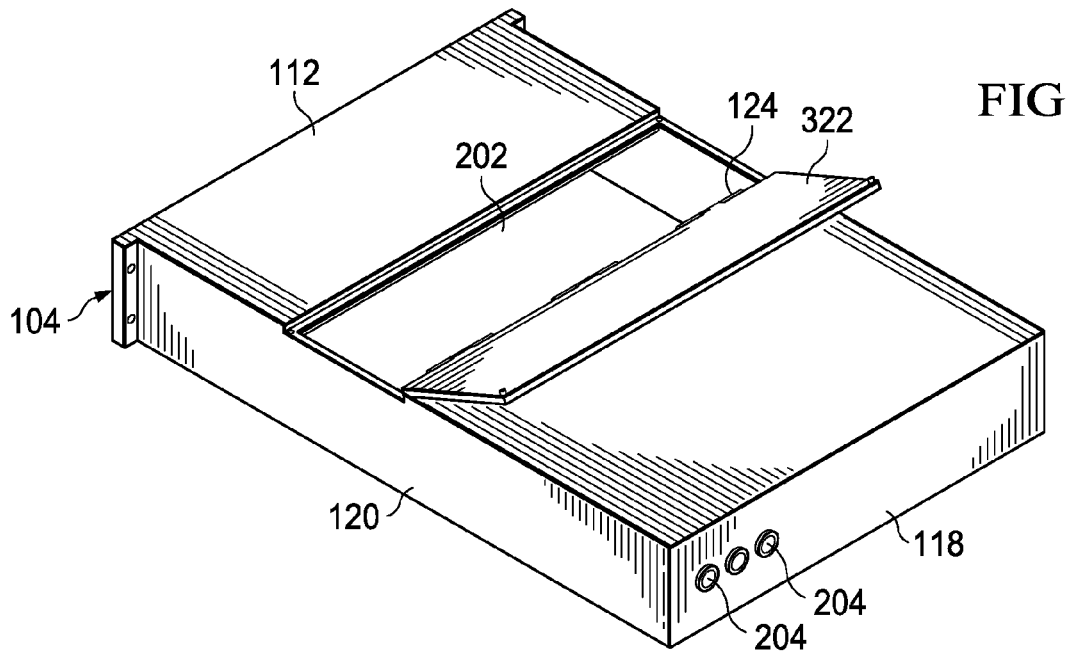
FIG. 3 shows a rack mountable enclosure that includes a longitudinally pivoting access panel in accordance with various embodiments.

FIG. 3 shows a rack mountable enclosure 104 that includes a longitudinally pivoting access panel 322 in accordance with various embodiments. The hinge 124 is attached to the rear of the access panel 322 and to an adjacent surface of the enclosure 104. Thus, the interior 202 of the enclosure is accessed by releasing a retaining mechanism (e.g., screws) and swinging the access panel 322 longitudinally towards the rear of the enclosure 104 on the hinge 124. As shown, multiple instances of the hinge 124 may be employed. Other embodiments use a single hinge unit.

In some embodiments, the hinge 124 may be disposed towards the front of the access panel 322 (i.e., the side opposite the hinged side of FIG. 3). In such an embodiment, the access panel 322 swings longitudinally towards the front of the enclosure 104.

FIG. 4 shows a cabinet 102 and a rack mounted enclosure 104 providing access to components 402 within the enclosure in accordance with various embodiments. The enclosure 104 is partially withdrawn from the cabinet 102. A retention mechanism securing the access panel 122 to the enclosure 104 has been released, and the access panel 122 has been pivoted laterally to allow access to the interior 202 of the enclosure 104.

Various components may be arranged within the interior 202 of the enclosure 104. For example, the enclosure 104 may house computer components such as processor modules, data/program storage modules, communications modules, power supply modules, etc. Some of the components disposed within the enclosure 104 may be hot-swappable (i.e., replaceable while enclosure 104 housed systems are powered and operating). Fans 402 are an exemplary hot-swappable component. A hot-swappable component, such as fan 402, may be extracted from the enclosure 104 and/or installed in the enclosure 104 while other components within the enclosure continue to operate. Thus, embodiments of the enclosure 104 reduce system down time by allowing enclosure 104 housed components to operate while components are accessed for service via the access panel 122. Embodiments of a rack mountable enclosure lacking the access panel 122 may require removal of the enclosure from the rack, thus requiring that enclosure be removed from service, or require that the enclosure be fully extended from the rack risking disconnection of cables coupled to the connectors 204 resulting in uncontrolled unit shutdown and data loss.

Figure 5A:
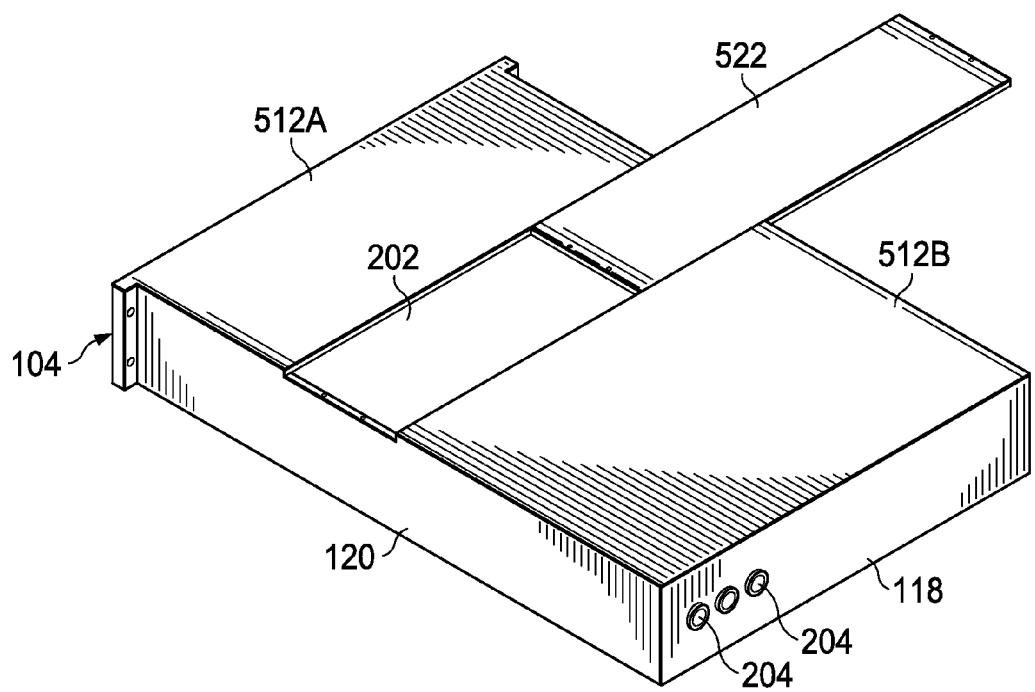
FIG. 5A shows a rack mountable enclosure that includes a laterally sliding access panel in accordance with various embodiments.

FIG. 5A shows a rack mountable enclosure that includes a laterally sliding access panel 522 in accordance with various embodiments. The access panel 522 engages the enclosure top panels 512A and 512B such that the access panel 512 is free to slide laterally while being retained (i.e., held to) the enclosure 104. Thus, the interior 202 of the enclosure 104 may be accessed while the enclosure 104 is partially extended from the cabinet 102, an access panel 522 retention mechanism (e.g., screws) is disengaged, and the access panel 522 is moved laterally.

Figure 5B:
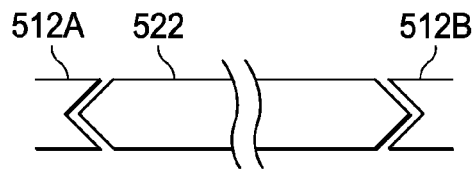
FIGS. 5B and 5C show enclosure/access panel interfaces in accordance with various embodiments.
Figure 5C:
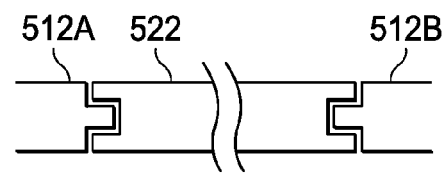

FIGS. 5B and 5C show exemplary enclosure top panel 512A/B to access panel 522 interfaces in accordance with various embodiments. As shown, the interfaces are formed to allow the access panel 522 to slide in one direction while retaining the access panel 522 in other directions. Various other enclosure 104 to access panel 522 interface configurations are conceivable, and the present disclosure encompasses all such configurations.

Figure 6:
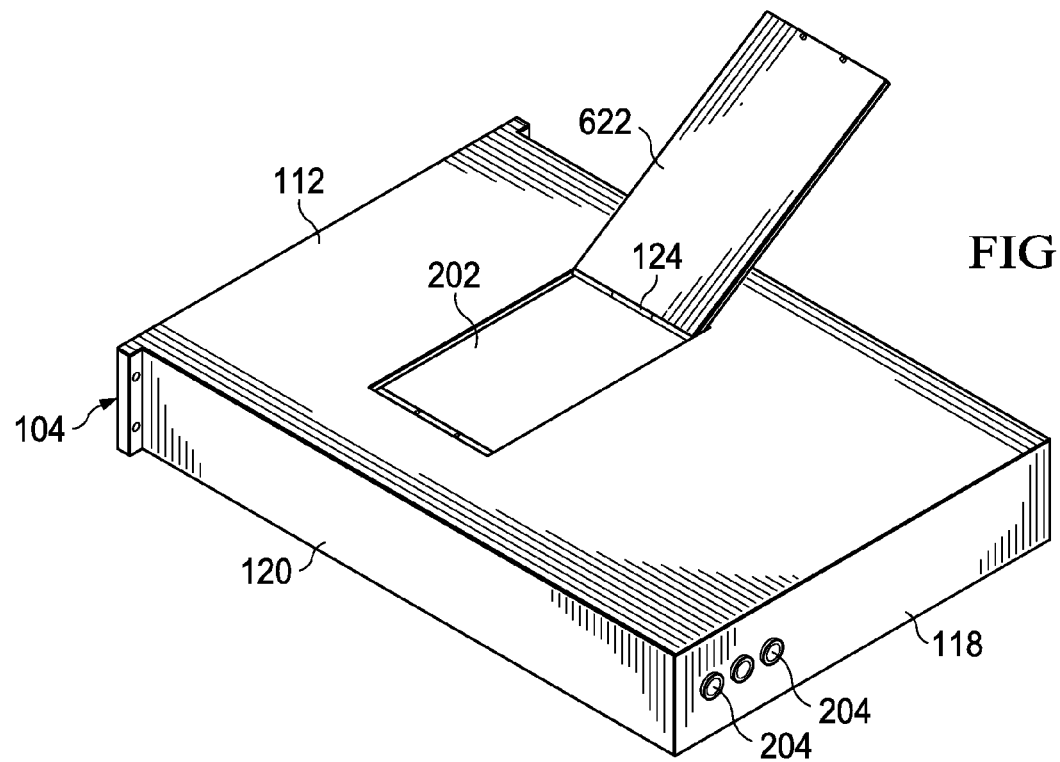
FIG. 6 shows a rack mountable enclosure that includes an access panel in accordance with various embodiments.

In some embodiments, the access panel 122 is disposed to provide access to selected components within the enclosure 104 and is sized accordingly. FIG. 6 shows an enclosure 104 that includes an access panel 622 disposed within the top panel 112. The access panel 622 may be dimensioned, as shown, to occupy less than the full width of the enclosure 104. In some embodiments, the dimensions and placement of the access panel 622 are selected to provide access to a given component (e.g., a component subject to frequent upgrade) within the enclosure 104. The access panel 622 may be moveably coupled to the enclosure 104 by a hinge 124.

Figure 7:
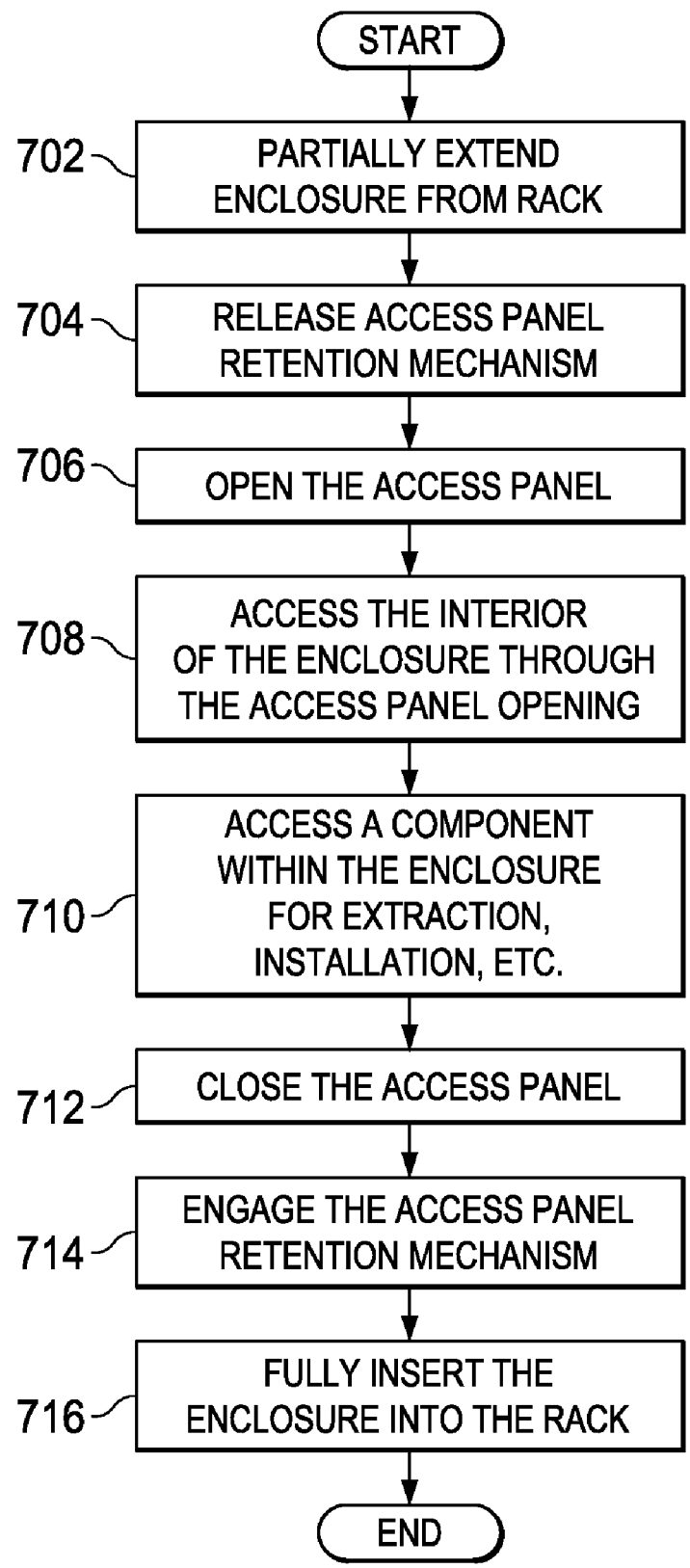
FIG. 7 shows a flow diagram for a method for accessing a component disposed within a rack-mounted enclosure in accordance with various embodiments.

FIG. 7 shows a flow diagram for a method for accessing a component disposed within a rack-mounted enclosure 104 in accordance with various embodiments. Though depicted sequentially as a matter of convenience, at least some of the actions shown can be performed in a different order and/or performed in parallel. Additionally, in some embodiments only some of the actions shown may be performed.

In block 702, the enclosure 104 is partially extended from the rack 102. For example, the enclosure 104 is extended from the rack 104 only far enough to move the access panel 122 outside of the rack 102. Various embodiments may require that ¼, ⅓, ½, etc. of the enclosure 104 be withdrawn from the rack 102. In some embodiments, the enclosure 104 and various components (e.g., fans 402) within the enclosure 104 continue to operate during the withdrawal and other operations of the present method.

In block 704, an access panel retention mechanism is disengaged. The retention mechanism may be screws, a latch, etc. The access panel is opened in block 706. In some embodiments, a hinge 124 moveably couples the access panel 122 to the enclosure 104 allowing pivotal movement of the access panel 122. In some embodiments, the access panel 522 slidingly engages the top panels 512A/B allowing the access panel 522 to be slidingly opened.

In block 708, the interior 202 of the enclosure 104 is accessed though the opening formed by movement of the access panel 122. A component (e.g., a fan 402, hot swappable field replaceable unit, etc.) disposed within the enclosure 104 is accessed in block 710. Component access facilitates inspection, extraction, installation, etc.

In block 712, the access panel 122 is closed thereby covering the opening. The access panel 122 retention mechanism is engaged, in block 714 (e.g., by installing screws), to secure the access panel 122 to the enclosure 104. In block 716, the enclosure 104 is fully inserted into the rack 102.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
an enclosure configured for rack mounting, the enclosure comprising:
an access panel disposed in a top surface of the enclosure, and configured to provide access to the interior of the enclosure;
wherein the access panel is moveably coupled to the enclosure;
wherein the access panel provides access to the interior of the enclosure while the enclosure is partly extending from a rack in which the enclosure is mounted.

2. The apparatus of claim 1, further comprising a hinge that moveably couples the access panel to the enclosure.

3. The apparatus of claim 2, wherein the hinge couples the access panel to the enclosure for one of lateral and longitudinal pivotal movement.

4. The apparatus of claim 1, further comprising a top panel wherein the top panel and the access panel are configured to provide sliding retention of the access panel.

5. The apparatus of claim 1, further comprising an electrically powered device disposed in the interior of the enclosure, wherein the access panel is configured to provide access to the electrically powered device while the device is operating, and while the enclosure is mounted in a cabinet, wherein the enclosure is inaccessible through the cabinet.

6. The apparatus of claim 1, wherein the access panel provides access for removal of a fan disposed within the enclosure while the enclosure is powered and less than fully withdrawn from a mounting rack.

7. The apparatus of claim 1, wherein the access panel is disposed within a front half of the top surface of the enclosure.

8. A method, comprising:
extending partially a rack-mountable enclosure from a cabinet configured to house the enclosure in which the enclosure is installed;
moving an access panel disposed in a top surface of the enclosure and moveably coupled to the enclosure to create an opening in the top surface extended from the cabinet and provide access to a component within the enclosure; and
accessing a component within the enclosure via the opening while the enclosure is partially extended from the cabinet.

9. The method of claim 8, wherein moving the access panel comprises pivoting the access panel on a hinge coupling the access panel to the enclosure.

10. The method of claim 8, wherein moving the access panel comprises sliding the access panel along a retention structure that holds the access panel to the enclosure.

11. The method of claim 8, further comprising operating electrical components within the enclosure during the extending, opening and accessing.

12. The method of claim 8, further comprising installing a component in an interior of the enclosure via the opening while electrical components within the enclosure are operating.

13. The method of claim 8, further comprising:
moving the access panel to close the opening; and
inserting fully the enclosure into the cabinet.

14. The method of claim 8, wherein extending partly includes withdrawing only a front one-third of the enclosure from the cabinet.

15. A system, comprising:
a cabinet configured to house a rack-mountable enclosure; and
a rack-mountable enclosure installed in the cabinet;
wherein the enclosure provides access to a component within the enclosure via an access panel in a top surface of the enclosure; and
wherein the access panel is moveably coupled to the enclosure and configured to provide access to the component while the enclosure is partially extended from the cabinet.

16. The system of claim 15, further comprising a hinge that pivotally couples the access panel to the enclosure.

17. The system of claim 16, wherein the access panel is configured to pivot one of laterally and longitudinally across the enclosure.

18. The system of claim 15, wherein the access panel is configured to slidingly engage a top panel of the enclosure.

19. The system of claim 15, wherein a cable connecting the enclosure to a different device remains electrically connected to the enclosure and the different device while the enclosure is extended and the component within the enclosure is accessed via the opening.

* * * * *